United States Patent [19]

Yamauchi et al.

[11] Patent Number: 4,944,925
[45] Date of Patent: Jul. 31, 1990

[54] APPARATUS FOR PRODUCING SINGLE CRYSTALS

[75] Inventors: Kazuhisa Yamauchi; Kazuo Sawada; Yoshihiro Nakai, all of Osaka, Japan

[73] Assignee: Sumitomo Electric Industries, Ltd., Osaka, Japan

[21] Appl. No.: 357,663

[22] Filed: May 25, 1989

Related U.S. Application Data

[60] Continuation of Ser. No. 85,858, Aug. 14, 1987, abandoned, which is a division of Ser. No. 872,523, Jun. 10, 1986, abandoned.

[30] Foreign Application Priority Data

Jun. 10, 1985 [JP] Japan ................................ 60-125765
Jun. 10, 1985 [JP] Japan ................................ 60-125766

[51] Int. Cl.$^5$ ........................ C30B 35/00; C30B 15/22
[52] U.S. Cl. ...................................... 422/249; 422/246; 136/607; 136/608; 136/617.1; 136/620.1; 164/132.2
[58] Field of Search ................ 422/246, 249; 156/607, 156/608, 617.1, 620.1; 164/122.2

[56] References Cited

U.S. PATENT DOCUMENTS

| | | | |
|---|---|---|---|
| 3,002,824 | 10/1961 | Francois | 422/249 |
| 3,291,650 | 12/1966 | Dohmen et al. | 156/617 SP |
| 3,915,656 | 10/1975 | Mlavsky et al. | 422/249 |
| 3,954,551 | 5/1976 | Cecil et al. | 156/617 SP |
| 3,980,438 | 9/1976 | Castonguay et al. | 422/249 |
| 4,196,171 | 4/1980 | Watanabe et al. | 422/246 |
| 4,242,589 | 12/1980 | Sachs | 156/608 |
| 4,269,652 | 5/1981 | Yancey | 156/607 |
| 4,390,505 | 6/1983 | Taylor et al. | 422/246 |

FOREIGN PATENT DOCUMENTS 2649201 5/1978 Fed. Rep. of Germany ...... 156/608

OTHER PUBLICATIONS

Sachs, Dynamics and Control of Meniscus Height in Ribbon Growth by the EFG Method, Journal of Crystal Growth 50 (1980), pp. 114 to 125.

*Primary Examiner*—John Doll
*Assistant Examiner*—Robert M. Kunemund
*Attorney, Agent, or Firm*—W. G. Fasse; D. H. Kane, Jr.

[57] ABSTRACT

A method of producing single crystals is characterized in that in withdrawing a semiconductor or dielectric material from its molten state while allowing it to grow into a single crystal solid, a die heated to a temperature higher than the solidifying point of the melt is disposed at the melt withdrawing outlet and the single crystal is withdrawn through the die.

4 Claims, 2 Drawing Sheets

APPARATUS FOR PRODUCING SINGLE CRYSTALS

This application is a Continuation of application Ser. No. :07/085,858, filed Aug. 14, 1987 now abandoned, and a Divisional of application Ser. No. :872,523 filed: Jun. 10, 1986, now abandoned.

FIELD OF THE INVENTION

This invention relates to an apparatus of producing single crystals of semiconductors, typically Si and GaAs, and dielectric materials, such as sapphire ($Al_2O_3$) and quartz ($SiO_2$).

DESCRIPTION OF THE PRIOR ART

Among the methods of producing single crystals are a crystal pulling method, also called the Czochralski method, and the Bridgman method (horizontal type and vertical type).

However, these methods offer the following problems: First, except for the Bridgman method, the prior art does not use anything for defining the shape of single crystals to be produced. Therefore, other various processes have to be applied before the final shape can be obtained, and the yield is low. Further, in conventional methods described above the, temperature gradient cannot be increased sufficiently for a stable solid-liquid interface and hence the stability of solid-liquid interface tends to be low. As a result, the crystal growth rate is decreased, leading to a low productivity. Further, the degree of perfectness of crystals grown by prior art methods becomes insufficient.

On the other hand, when it is desired to define the cross-sectional shape of single crystals to be produced, the EFG (edge-defined film fed growth) method or the like has been employed. With this EFG method, the properties of the object material and of the die are limited by the wetting property of the material. In other words, this method can be applied only when it is desired to obtain sapphire boards ($Al_2O_3$).

SUMMARY OF THE INVENTION

An object of the invention is to provide a method for producing single crystals which is capable of defining the shape of single crystals to be produced, and to improve the stability of the solid-liquid interface.

The single crystal producing method according to this invention is characterized in that when a semiconductor or dielectric material is withdrawn from its molten state for growth into a single crystal solid, a die heated to a temperature above the solidifying point of the melt is placed at the melt withdrawing outlet and a single crystal is withdrawn through said die.

By suitably selecting the shape of the die to be placed at the melt withdrawing outlet, it becomes possible to define the shape of a single crystal to be obtained. Therefore, a single crystal which has substantially the final shape can be obtained whereby the yield is increased.

Since a die heated to a temperature above the solidifying point of the melt is used, growth of unnecessary crystal cores can be prevented, making it easier to obtain a perfect single crystal. Further, it is also possible to provide a sharp temperature gradient to thereby improve the stability of the solid-liquid interface. Thus, the crystal growth rate can be increased, leading to an increase in productivity.

In this invention, since the shape of the single crystal is defined from the start, there is no need for having to support a great weight at the narrow diameter portion even when a semiconductor or dielectric material is being pulled up from its molten state. This means that it is no longer necessary to support such a great weight as is seen in the conventional, Czochralski method. This feature of the invention, coupled with the stability of the solid-liquid interface of the invention, makes it easier to produce semiconductor or dielectric bars of substantial length. Further, since a crucible as found in the Bridgman method is not used, single crystals can be increased in length and made continuous.

The die to be placed at the melt withdrawing outlet is heated preferable to a temperature 1°–20° C. higher than the temperature of the melt. Heating the die to a temperature higher than the temperature of the melt provides an increased temperature gradient and greater stability of the solid-liquid interface when the melt is withdrawn. Therefore, the withdrawing rate can also be increased. Increasing the temperature of the entire melt might be contemplated, but this could accelerate reaction between the melt and the crucible. In this sense, too, it is desirable to increase the temperature of the die. However, if the temperature difference between the die and melt is greater than 20° C, reaction between the die and the melt is accelerated, which is not desirable. A suitable difference in temperature between the melt and the die is 5° C.

As for the direction of withdrawing a semiconductor or dielectric material from its molten state, according to the invention the withdrawal direction may extend upwardly downwardly or horizontally.

In addition, in the case where a semiconductor or dielectric melt is withdrawn through a die, quick cooling should preferable be avoided, since quick cooling could result in internal defects tending to be produced in a single crystal to be obtained, adversely affecting the internal properties of the single crystal.

Examples of semiconductors are Si, GaAs, GaP, InP, and CdTe. In the case where the invention is applied to semiconductors, it is desirable that for preventing the spattering of volatile components, withdrawal of the melt be performed in a high pressure atmosphere. For the same reason, it is preferable to surround the area around the periphery of the melt withdrawing outlet with low-melting glass. An example of such a low-melting glass is $B_2O_3$. Further, among the materials to be used as dies are graphite and silicon carbide.

Examples of dielectric materials are sapphire ($Al_2O_3$), BGO ($Bi_4Ge_3O_{12}$), LN ($LiNbO_3$), LT ($LiTaO_3$), GGG ($Gd_3Ga_5O_{12}$), YAG ($Y_2Al_5O_{12}$), quartz ($SiO_2$), and alkali halides (such as NaCl).

Single crystals of dielectric materials have high melting points and must be protected from contamination. Therefore, in producing single crystals of a dielectric material, it is preferable that the material of which the die is made be a material selected from the group consisting of platinum, rhodium iridium, platinum alloys, rhodium alloys and iridium alloys.

DECRIPTION OF PREFERRED EXAMPLE AND EMBODIMENTS AND OF THE BEST MODE OF THE INVENTION

EXAMPLE 1

Figure 1:
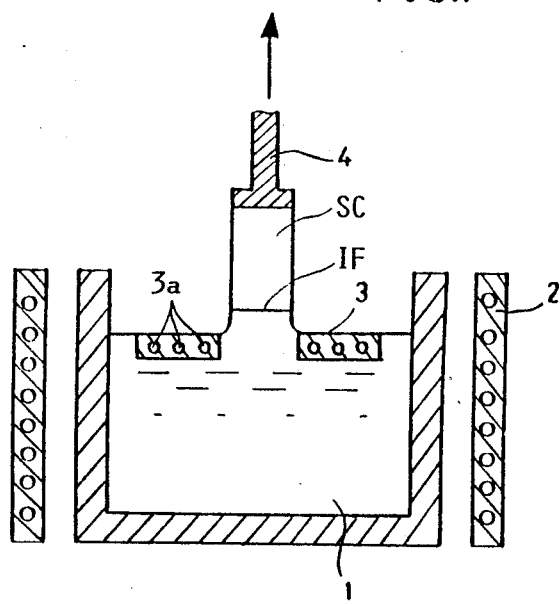
FIG. 1 is a schematic view showing an example of an apparatus used in carrying out this invention.

Single crystals of semiconductor materials were produced using an apparatus shown in FIG. 1. In the figure, the numeral 1 denotes Si kept molten by a first heater 2. As shown, a doughnut-shaped heating die 3 forms a second heater heated to a temperature above the solidifying point of the melt, is disposed at the melt withdrawing outlet. The Si was pulled up as a single crystal through said heating die 3 by a pull-up jig 4. Heating members 3a are shown directly inside the heating die 3 to form said second heater as an integral structure with the die.

The maximum pull-up rate attained was about 300 mm/min.

EXAMPLE 2

Figure 2:
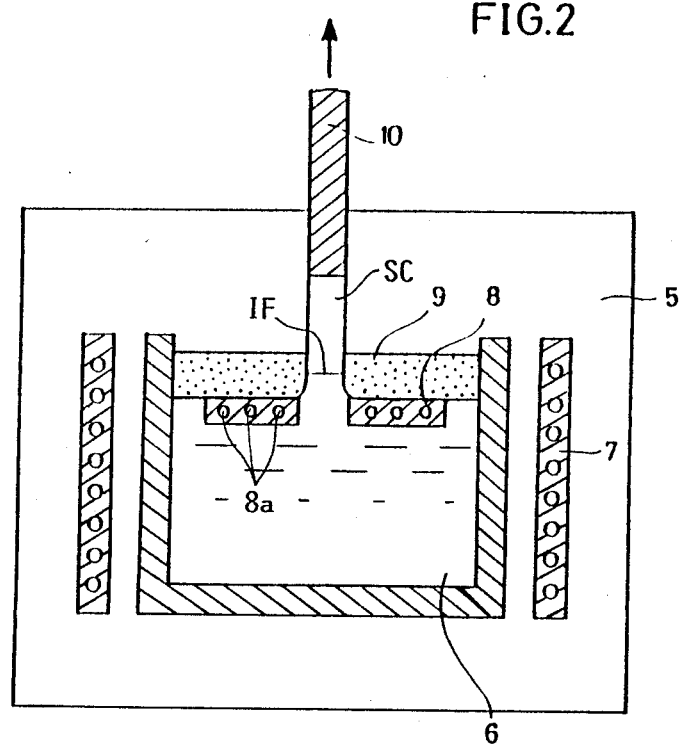
FIG. 2 is a schematic view showing another example of an apparatus used in carrying out the invention.

Single crystals of semiconductor materials were produced using an apparatus shown in FIG. 2. In this example, a single crystal was pulled up within a pressurized chamber 5. The numeral 6 denotes GaAs kept molten by a first heater 7. As shown, a heating die 8 forms a second heater heated to a temperature higher than the solidifying point of the melt is disposed at the melt withdrawing outlet. Heating members 8a are shown directly inside the heating die 8 to form said second heater as an integral structure with the die. The heating die 8 had a 1 mm×30 mm slot. Further, as shown, the area around the periphery of the withdrawing outlet was surrounded with an about 20 mm-thick layer 9 of $B_2O_3$.

With a pressure of 70 kg/cm² maintained in the pressurized chamber 5, a single crystal of GaAs was pulled up by a jig 10; the pull-up rate attained was about 100 mm/min.

EXAMPLE 3

Figure 3:
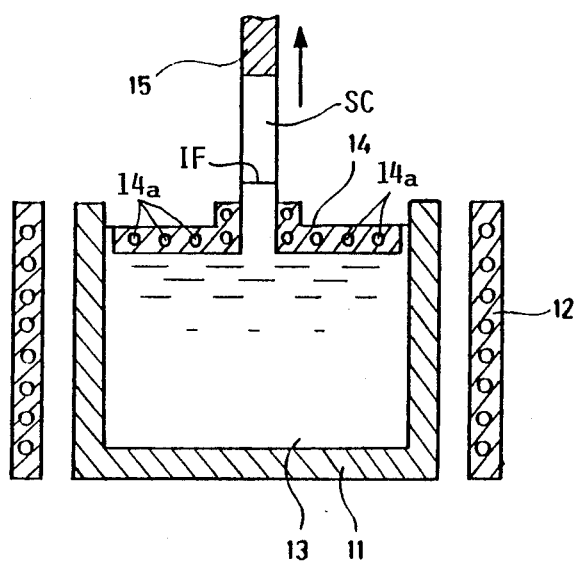
FIG. 3 is a schematic view showing a further example of an apparatus for carrying out the invention.

Single crystals of a dielectric material were produced using an apparatus shown in FIG. 3. $LiNbO_3$ kept in a molten state by a first heater 12 was contained in a crucible 11. As shown, disposed at the melt withdrawing outlet is a heating die 14 forming a second heater heated to a temperature higher than the solidifying point of the melt. Heating members 14a are shown directly inside the heating die 14 to form said second heater as an integral structure with the die. The crucible 11 and heating die 14 were made of platinum. Incidentally the melting point of $LiNbO_3$ is 1250° C.

A single crystal was continuously pulled up into a 30 mm wide×2 mm thick plate form by using a withdrawing jig 15. The withdrawing rate attained was greater than about 50 cm/min.

Further, using a crucible and a heating die which were made of iridium, a 50 mm-diameter round bar of $Gd_3Ga_5O_{12}$ (GGG) having a single crystal was successfully produced.

All three FIGS. show the horizontal line IF which is the interface between the solid single crystal SC and the liquid melt. These FIGS. also show that the second heating members 3a, 8a, and 14a are embedded in the respectively heating die body 3, 8, and 14.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for growing single crystals, comprising a crucible for holding a melt of material of which said single crystals are to be grown, first separately controllable heating means arranged for heating said crucible to a first melt temperature sufficient to keep said material in a molten state in said crucible, a die located in contact with said melt, said die consisting of a die body forming a melt withdrawing outlet located for pulling a single crystal out of said melt and of second heating means controllable separately and independently of said first heating means, said second heating means being embedded directly inside said die body around said melt withdrawing outlet of said die body so that said die body and said second heating means form a single integral one piece structure for independently and directly heating said die body to a second die temperature sufficiently higher than said first melt temperature for maintaining a well defined temperature gradient between said melt and said die outlet for stabilizing a solid-liquid interface at or near said melt withdrawing outlet of said die body.

2. The apparatus of claim 1, further comprising layer means covering said integral structure of said second heater means and said die body.

3. The apparatus of claim 2, wherein said layer means comprise at least one layer of boric oxide on said integral structure of said die body and second heating means.

4. The apparatus of claim 1, wherein said integral structure of said die body and said second heating means form approximately a doughnut shape.

* * * * *